(12) United States Patent
Wilkerson

(10) Patent No.: US 9,735,758 B2
(45) Date of Patent: *Aug. 15, 2017

(54) TUNABLE FILTER DEVICES AND METHODS

(71) Applicant: Physical Devices, LLC, Durham, NC (US)

(72) Inventor: Jonathan Ryan Wilkerson, Raleigh, NC (US)

(73) Assignee: PHYSICAL DEVICES, LLC, Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/149,030

(22) Filed: May 6, 2016

(65) Prior Publication Data

US 2016/0329879 A1    Nov. 10, 2016

Related U.S. Application Data

(63) Continuation of application No. 13/820,064, filed as application No. PCT/US2011/049399 on Aug. 26, 2011, now Pat. No. 9,350,401.

(60) Provisional application No. 61/402,416, filed on Aug. 30, 2010, provisional application No. 61/510,330, filed on Jul. 21, 2011.

(51) Int. Cl.
| | | |
|---|---|---|
| H04B 1/10 | (2006.01) | |
| H04B 1/16 | (2006.01) | |
| H03H 11/04 | (2006.01) | |
| H04B 1/12 | (2006.01) | |
| H03H 7/46 | (2006.01) | |
| H03H 11/34 | (2006.01) | |

(52) U.S. Cl.
CPC ......... *H03H 11/0405* (2013.01); *H04B 1/12* (2013.01); *H04B 1/123* (2013.01); *H03H 7/46* (2013.01); *H03H 11/34* (2013.01); *H03H 2210/012* (2013.01); *H03H 2250/00* (2013.01)

(58) Field of Classification Search
CPC .......... H04B 1/04; H04B 1/40; H04B 1/0475; H04B 15/00
USPC .......... 455/307, 339; 333/138, 139, 140, 166
See application file for complete search history.

(56) References Cited

U.S. PATENT DOCUMENTS

| | | |
|---|---|---|
| 3,946,337 A | 3/1976 | Philips et al. |
| 4,085,368 A | 4/1978 | Yeh |
| 4,313,116 A | 1/1982 | Powell et al. |
| 5,179,727 A | 1/1993 | Imagawa |

(Continued)

FOREIGN PATENT DOCUMENTS

| | | | |
|---|---|---|---|
| EP | 1 727 277 A1 | 11/2006 | |
| WO | WO 2012/030658 A2 | 3/2012 | |

(Continued)

OTHER PUBLICATIONS

Notice of Allowance and Fee(s) Due for U.S. Appl. No. 14/927,374 (May 23, 2016).

(Continued)

*Primary Examiner* — Quochien B Vuong
(74) *Attorney, Agent, or Firm* — Jenkins, Wilson, Taylor & Hunt, P.A.

(57) ABSTRACT

Analog interference filter devices and methods for isolation of desirable portions of a radio frequency signal. Signal compensation is used to provide desirable center frequency, passband width, ripple, rolloff, stopband and distortion performance. The filter is implemented with passive and/or active components.

8 Claims, 11 Drawing Sheets

(56) References Cited

U.S. PATENT DOCUMENTS

| | | |
|---|---|---|
| 5,252,930 A | 10/1993 | Blauvelt |
| 5,285,479 A | 2/1994 | Iwane |
| 5,386,198 A | 1/1995 | Ripstrand et al. |
| 5,412,735 A | 5/1995 | Engebretson et al. |
| 5,442,582 A | 8/1995 | Lange et al. |
| 5,712,641 A | 1/1998 | Casabona et al. |
| 5,736,909 A | 4/1998 | Hauser et al. |
| 5,783,977 A | 7/1998 | Chethik |
| 5,872,540 A | 2/1999 | Casabona et al. |
| 6,154,641 A | 11/2000 | Zhang |
| 6,172,970 B1 | 1/2001 | Ling et al. |
| 6,175,327 B1 | 1/2001 | Lin et al. |
| 6,201,955 B1 | 3/2001 | Jasper et al. |
| 6,236,315 B1 | 5/2001 | Helms et al. |
| 6,314,127 B1 | 11/2001 | Lynch et al. |
| 6,323,806 B1 | 11/2001 | Greving |
| 6,359,503 B1 | 3/2002 | Alini et al. |
| 6,363,263 B1 | 3/2002 | Reudink et al. |
| 6,385,435 B1 | 5/2002 | Lee |
| 6,486,828 B1 | 11/2002 | Cahn et al. |
| 6,590,528 B1 | 7/2003 | DeWulf |
| 6,639,541 B1 | 10/2003 | Quintana et al. |
| 6,710,739 B1 | 3/2004 | Loegering |
| 6,847,803 B1 | 1/2005 | Rauhala et al. |
| 6,961,577 B2 | 11/2005 | Nagato et al. |
| 7,139,592 B2 | 11/2006 | Leifer et al. |
| 7,904,047 B2 | 3/2011 | Darabi |
| 8,032,103 B2 | 10/2011 | Lackey |
| 8,064,837 B2 | 11/2011 | Sampath |
| 8,078,100 B2 | 12/2011 | Proctor, Jr. et al. |
| 8,086,206 B1 | 12/2011 | Lackey |
| 8,090,338 B1 | 1/2012 | Lackey |
| 8,090,339 B1 | 1/2012 | Lackey |
| 8,351,889 B2 | 1/2013 | Roussel et al. |
| 8,355,676 B2 | 1/2013 | Franklin |
| 8,380,771 B2 | 2/2013 | Hahn et al. |
| 8,666,347 B2 | 3/2014 | Wilkerson et al. |
| 8,682,275 B2 | 3/2014 | Kerth et al. |
| 8,965,319 B2 | 2/2015 | Wilkerson et al. |
| 9,042,857 B2 | 5/2015 | Vosburgh et al. |
| 9,203,461 B2 | 12/2015 | Vosburgh et al. |
| 9,219,508 B1 | 12/2015 | Veysoglu et al. |
| 9,350,401 B2 | 5/2016 | Wilkerson |
| 9,519,062 B2 | 12/2016 | Vosburgh et al. |
| 2002/0122406 A1 | 9/2002 | Chillariga et al. |
| 2002/0125947 A1 | 9/2002 | Ren |
| 2003/0130751 A1 | 7/2003 | Lim |
| 2004/0185815 A1 | 9/2004 | Fukuda et al. |
| 2006/0262880 A1 | 11/2006 | Mizuta et al. |
| 2007/0066226 A1 | 3/2007 | Cleveland et al. |
| 2008/0136473 A1 | 6/2008 | Bollenbeck et al. |
| 2008/0211715 A1 | 9/2008 | Feintuch et al. |
| 2010/0022197 A1 | 1/2010 | Kato et al. |
| 2010/0048156 A1 | 2/2010 | Hahn |
| 2010/0136925 A1 | 6/2010 | Lackey |
| 2010/0136941 A1 | 6/2010 | Lackey |
| 2010/0178874 A1 | 7/2010 | Chiou et al. |
| 2010/0244943 A1 | 9/2010 | Hahn et al. |
| 2011/0019722 A1 | 1/2011 | Amirkhany |
| 2011/0227665 A1 | 9/2011 | Wyville |
| 2011/0300813 A1 | 12/2011 | Mirzaei et al. |
| 2012/0025929 A1 | 2/2012 | Muterspaugh et al. |
| 2012/0201153 A1 | 8/2012 | Bharadia et al. |
| 2012/0201173 A1 | 8/2012 | Jain et al. |
| 2012/0252392 A1 | 10/2012 | Wilkerson et al. |
| 2013/0225099 A1 | 8/2013 | Vosburgh et al. |
| 2014/0152499 A1 | 6/2014 | Vosburgh et al. |
| 2014/0185723 A1 | 7/2014 | Belitzer |
| 2014/0199956 A1 | 7/2014 | Wilkerson |
| 2014/0235190 A1 | 8/2014 | Wilkerson et al. |
| 2015/0244431 A1 | 8/2015 | Vosburgh |
| 2015/0288413 A1 | 10/2015 | Vosburgh et al. |
| 2016/0087659 A1 | 3/2016 | Vosburgh et al. |
| 2016/0329926 A1 | 11/2016 | Vosburgh |

FOREIGN PATENT DOCUMENTS

| | | |
|---|---|---|
| WO | WO 2013/056270 A1 | 4/2013 |
| WO | WO 2013/130818 A1 | 9/2013 |
| WO | WO 2014/113613 A1 | 7/2014 |

OTHER PUBLICATIONS

Final Office Action for U.S. Appl. No. 13/781,226 (Feb. 12, 2016).

Non-Final Office Action for U.S. Appl. No. 14/927,374 (Jan. 25, 2016).

Notice of Allowance and Fee(s) Due for U.S. Appl. No. 13/820,064 (Jan. 22, 2016).

Non-Final Office Action for U.S. Appl. No. 14/629,326 (Jan. 22, 2016).

Communication of European publication number and information on the application of Article 67(3) EPC for European Application No. 14740838.9 (Oct. 28, 2015).

Extended European Search Report for European Patent Application No. 13754265.0 (Oct. 14, 2015).

Extended European Search Report for European Patent Application No. 12839313.9 (Sep. 24, 2015).

Restriction and/or Election Requirement for U.S. Appl. No. 14/629,326 (Sep. 23, 2015).

Final Office Action for U.S. Appl. No. 13/820,064 (Sep. 9, 2015).

Notice of Allowance and Fee(s) Due for U.S. Appl. No. 14/719,302 (Jul. 31, 2015).

Non-Final Office Action for U.S. Appl. No. 13/781,226 (Jul. 6, 2015).

Communication pursuant to Rule 164(1) EPC for European Patent Application No. 12839313.9 (Jun. 2, 2015).

Commonly-assigned, co-pending U.S. Appl. No. 14/719,302 for "Methods, Systems, and Non-Transitory Computer Readable Media for Wideband Frequency and Bandwidth Tunable Filtering," (Unpublished, filed May 21, 2015).

Commonly-assigned, co-pending U.S. Appl. No. 14/629,326 for "Devices and Methods for Diversity Signal Enhancement and Cosite Cancellation," (Unpublished, filed Feb. 23, 2015).

Non-Final Office Action for U.S. Appl. No. 13/820,064 (Feb. 18, 2015).

Notice of Allowance and Fee(s) Due for U.S. Appl. No. 13/745,729 (Jan. 22, 2015).

Communication of European Publication Number and Information on the Application of Article 67(3) EPC for European Patent Application No. 13754265.0 (Dec. 10, 2014).

Restriction/Election Requirement for U.S. Appl. No. 13/745,729 (Nov. 12, 2014).

First Office Action for Chinese Patent Application No. 201180051482.8 (Oct. 29, 2014).

Notice of Allowance and Fee(s) Due for U.S. Appl. No. 14/194,924 (Oct. 17, 2014).

Communication of European Publication Number and Information on the Application of Article 67(3) EPC for European Patent Application No. 12839313.9 (Jul. 23, 2014).

Non-Final Office Action for U.S. Appl. No. 14/194,924 (Jun. 13, 2014).

Notification of Transmittal of the International Search Report and the Written Opinion of the International Searching Authority, or the Declaration for PCT International Patent Application No. PCT/US2014/011941 (Apr. 29, 2014).

Extended European Search Report for European Application No. 11822404.7 (Jan. 17, 2014).

Notice of Allowance and Fee(s) Due for U.S. Appl. No. 13/271,420 (Oct. 15, 2013).

Bharadia et al., "Full Duplex Radios," pp. 1-12 (Aug. 12, 2013).

Notification of Transmittal of the International Search Report and the Written Opinion of the International Searching Authority, or the Declaration for PCT International Patent Application No. PCT/US2013/028338 (Jul. 25, 2013).

Notice of Allowance and Fee(s) Due for U.S. Appl. No. 13/271,420 (Jun. 25, 2013).

(56) References Cited

OTHER PUBLICATIONS

Communication of European Publication Number and Information on the Application of Article 67(3) EPC for European Patent Application No. 11822404.7 (Jun. 12, 2013).

Notification of Transmittal of the International Search Report and the Written Opinion of the International Search Authority, or the Delcaration for PCT International Patent Application No. PCT/US2012/066259 (Mar. 28, 2013).

Commonly-assigned, co-pending U.S. Appl. No. 13/781,226 for "Methods, Systems, and Computer Readable Media for Mitigation of In-Band Interference of Global Positioning System (GPS) Signals," (Unpublished, filed Feb. 28, 2013).

Non-Final Action for U.S. Appl. No. 13/271,420 (Feb. 6, 2013).

Commonly assigned, co-pending U.S. Appl. No. 13/745,729 titled "Methods, Systems, and Non-Transitory Computer Readable Media for Wideband Frequency and Bandwidth Tunable Filtering," (unpublished, filed Jan. 18, 2013).

International Search Report for International Patent Application No. PCT/US2011/049399 (Mar. 2, 2012).

Jain et al., "Practical, Real-time, Full Duplex Wireless," pp. 1-12 (Sep. 19, 2011).

U.S. Appl. No. 61/485,980 for "Adaptive Techniques for Full-Duplex Wireless," (May 13, 2011).

U.S. Appl. No. 61/462,493 for "Single Channel Full-Duplex Wireless Communication," (Feb. 3, 2011).

Choi et al., "Achieving Single Channel, Full Duplex Wireless Communication," pp. 1-12 (Sep. 20, 2010).

Widrow et al., "Adaptive Inverse Control," Proceedings of the 1993 International Symposium on Intelligent Control, pp. 1-6 (Aug. 1993).

Non-Final Office Action for U.S. Appl. No. 15/216,809 (Jan. 19, 2017).

Extended European Search Report for European Application No. 14740838.9 (Sep. 23, 2016).

Notice of Allowance and Fee(s) Due for U.S. Appl. No. 13/781,226 (Aug. 3, 2016).

Commonly-asssigned, co-pending U.S. Appl. No. 15/216,809 for "Devices and Methods for Diversity Signal Enhancement and Cosite Cancellation," (Unpublished, filed Jul. 22, 2016).

Applicant-Initiated Interview Summary for U.S. Appl. No. 13/781,226 (Jun. 14, 2016).

TUNABLE FILTER DEVICES AND METHODS

CROSS-REFERENCE TO RELATED APPLICATIONS

This application is a continuation of U.S. patent application Ser. No. 13/820,064, filed Mar. 13, 2014, which is a National Stage Application filed under 35 U.S.C. §371 of PCT International Application No. PCT/US2011/049399 filed Aug. 26, 2011, which claims the benefit of U.S. Provisional Patent Application Ser. No. 61/402,416 filed on Aug. 30, 2010 and U.S. Provisional Patent Application Ser. No. 61/510,330 filed on Jul. 21, 2011. The disclosures of all of these applications are incorporated herein by reference in their entireties.

The aforementioned provisional patent applications are hereby incorporated by reference in their entirety.

STATEMENT REGARDING FEDERALLY SPONSORED RESEARCH OR DEVELOPMENT

None.

BACKGROUND OF THE INVENTION

Field of the Invention

This invention relates to radio frequency communication. More specifically, it relates to tuning of devices to selectively receive desired signals.

Brief Description of the Related Art

Consumer demand for wireless connectivity by smart phones, pads and notebook computers ("smart phones") is exploding, with national demand expected to exceed capacity by 2013. In response, the federal government is expanding the amount of unlicensed spectrum available to consumers. This newly available spectrum and the need for more efficient use of existing spectrum are driving the rapid proliferation of frequency band to which a smart phone must tune.

Existing filter and off-chip resonator technology used to select frequency channels can be tuned only over a limited frequency range. As a result, the number of filters integrated in a smart phone is growing rapidly, increasing the cost, complexity and space burden imposed by the filters. Without a widely tunable filter, the proliferation of filters will adversely impact the economic value of smart phone, degrade consumer acceptance and slow growth of the industry.

In light of the above, we disclose interference based tuning devices and methods for smart phones to isolate radio frequency signals of interest. Tuning by interference employing control of amplitude, phase and group delay enables an ultra-wideband tunable filter that can be tuned rapidly and reliably to any current or anticipated mobile wireless frequency.

SUMMARY OF THE INVENTION

The first object of the invention is to provide better utilization of RF spectrum. The second object is to provide a tunable filter for RF signals. The third object is to provide a band-passed signal output having a tunable center frequency and/or pass-band bandwidth. The fourth object is to provide a rapidly tunable filter. The fifth object is to provide a plurality of signals tuned to different center frequencies and/or pass-band widths. The sixth object is to provide a band-passed signal having reduced distortion content.

The invention comprises devices and methods for inherently stable continuously-variable ultra-wideband tunable filtering of radio frequency signals for use with a multi-band smart phone or other type of radio. This filter comprises devices and methods of analog, feed-forward interference filtering to provide a desirably band-passed signal.

The invention comprises devices and methods for continuously tuning a signal to provide at least one desirable aspect of: center frequency, passband width, ripple, rolloff and stopband. The filter comprises devices and methods for providing a plurality of desirably received signals from a detected signal. And, it comprises devices and methods for spatial domain filtering of detected signals.

The filter can be implemented in any type of circuitry such as the physical layer of a cell phone handset, although other implementations are also acceptable. It can be implemented with passive and/or active components not requiring high voltage. It is described in terms of receivers, but can also be used in transmitters.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which.

DETAILED DESCRIPTION OF THE PREFERRED EMBODIMENTS

Unless defined otherwise, terms are used herein according to their generally accepted engineering definitions. Although described in terms of signal reception, filter can be used in signal transmission. Although described in terms of RF electrical signals, this disclosure is intended to cover electrical and electromagnetic signals of any frequency as well as other physical signals including radar, light, and sound among others. The device, herein after referred to as a filter, can comprise any circuit type, such as electrical, electronic, optoelectronic, complementary metallic-oxide semiconductor or other.

Although the filter is illustrated here as a series configuration, parallel and mixed parallel and series configurations are acceptable. For purposes of this disclosure, configuring is intended to include tuning and connections of cells and/or units. It should also be noted that steps of configuring, e.g. tuning, are mathematically associative and commutative and, therefore can be conducted in any desirable temporal and/or spatial sequence. Although described in terms of two channels and two units, any number of channels and units are acceptable.

Desired frequency is defined as one or more frequency component of a signal that is desirably retained. Desired frequency can comprise one or more passband, although other types are acceptable. Undesired frequency is defined as not a desired frequency. A null bandpass signal is defined as having substantially reduced amplitude at desired frequency. Distortion free signal is defined as having distortion substantially removed or prevented at desired frequency. A native signal is defined as substantially unmodified other than with respect to transit time.

The invention comprises filter devices and methods for continuously-variable ultra-wideband tuning of a radio frequency (RF) filter center frequency, passband bandwidth, passband ripple, passband rolloff, and stopband attenuation. Filter output comprises at least one desirable passband feature of: center frequency, width, ripple and rolloff, as well as stopband attenuation. Feed-forward interference filtering among a detected signal and modified variants thereof is used to provide a desirably filtered signal.

Filter can be implemented with any type of passive and/or active analog components that can modify at least one signal aspect of: phase, amplitude and group delay. In some cases, analog components can be connected to at least one mixed signal and/or digital component, such as for communications, digitizing or control. Filter operates by at least one of: splitting, phase shifting, amplitude adjusting, delaying, interfering, bypassing, and combining, which operations can be modified before or in use. Filter can operate at low voltage, e.g. less than 5 volts. Filter is preferably a solid state device fabricated with any suitable solid state, nano- or other material. It can comprise any physical type, e.g. chip component, chip, module, or circuit board.

Figure 1:
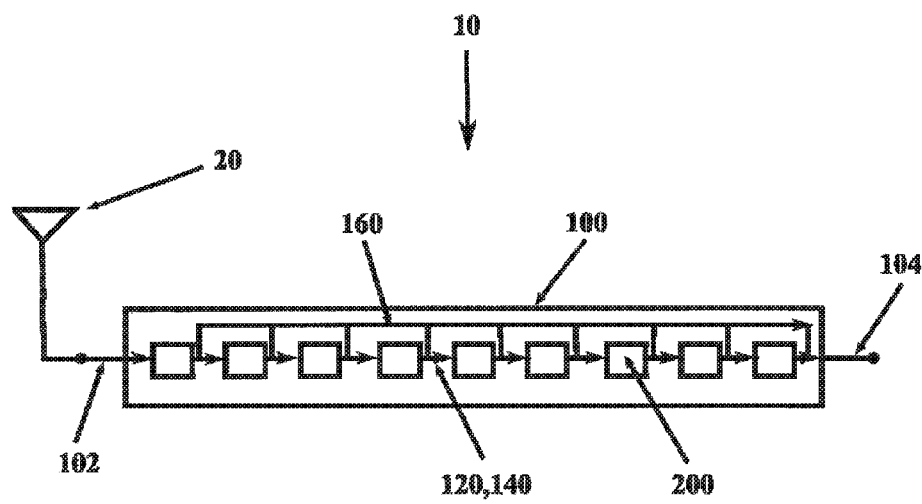
FIG. 1: Schematic of a unit comprising a series of cells.

FIG. 1 illustrates a filter 10 connected to an antenna 20, which filter 10 comprises at least one unit 100 comprising at least one cell 200 shown here connected in series although other configurations are also acceptable. Unit 100 can comprise any number of cells 200 such as between 1 and 100. Filter 10 comprises unit input lead 102 and unit output lead 104. First cell output lead 140 can further comprise second cell input lead 120. A unit 100 can comprise a bypass 160 of any type that can bypass a signal with respect to one or more cells 200.

Figure 2A:
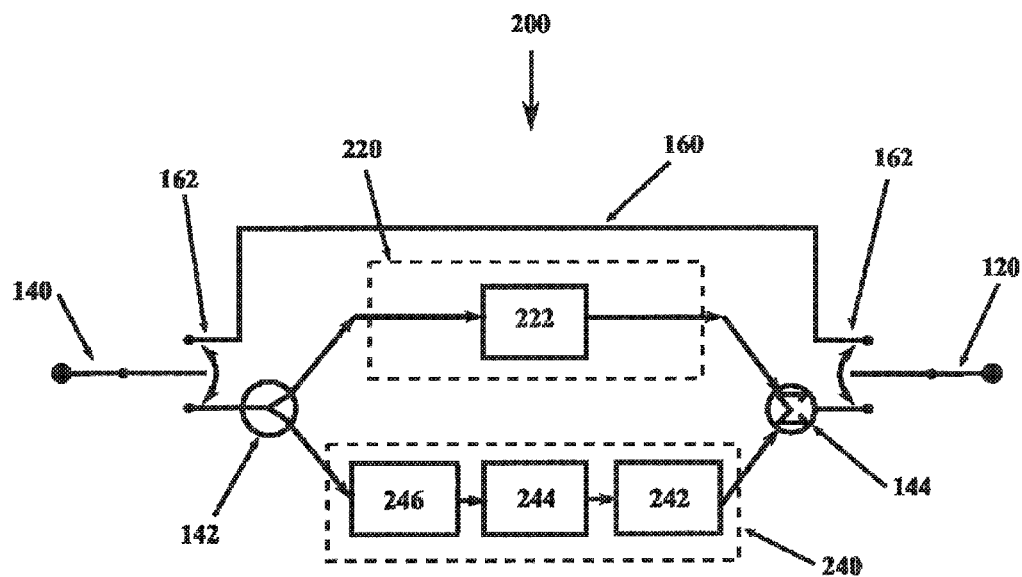
FIG. 2A: Schematic of a cell comprising a first channel delay element.

FIG. 2A illustrates a cell 200 comprising cell input line 140, splitter 142, combiner 144, cell output line 120, bypass 160, first channel 220 and second channel 240. Splitter 142 is any type of device that can provide input signal to first channel 220 and to second channel 240. Combiner 144 is any type that can combine signal from first channel 220 and signal from second channel 240. Bypass 160 further comprises at least one bypass switch 162 of any type that can be used to bypass a signal around cell 200. Bypass can comprise any type, including but not limited to delay providing. In the illustrated embodiment, first channel 220 comprises a first channel delay element 222 and second channel 240 comprises at least one of: second channel delay element 242, second channel phase shifter 244 and second channel amplitude compensator 246. Delay element 222, 242 and phase shifter 224, 244 comprise any type, including but not limited to gyrator, active inductor and variable gain amplifier type.

Figure 2B:
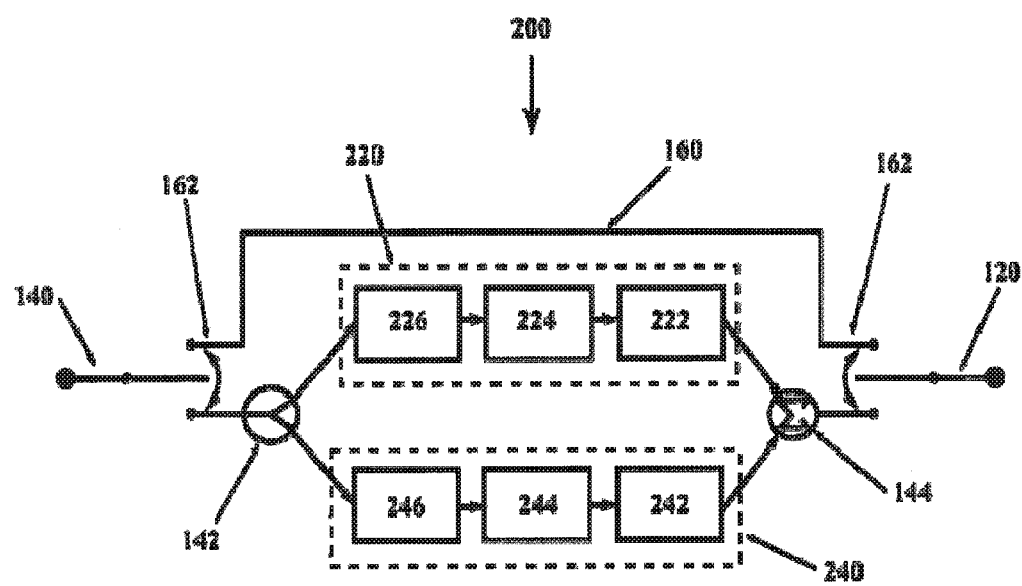
FIG. 2B: Schematic of a cell comprising first channel element, phase shifter and amplitude compensator.

FIG. 2B illustrates a cell 200 comprising a first channel 220 further comprising at least one of: first phase shifter 224 and first amplitude compensator 226, with the phase shifter 224 configured before or after amplitude compensator 226. Delay element 222, 242 is any type of circuit element that can alter travel time of at least a portion of a signal, Phase shifter 224, 244 is any type of device that can alter phase of at least a portion of a signal. Amplitude compensator 226, 246 is any type of device that can alter amplitude of at least a portion of a signal.

Figure 2C:
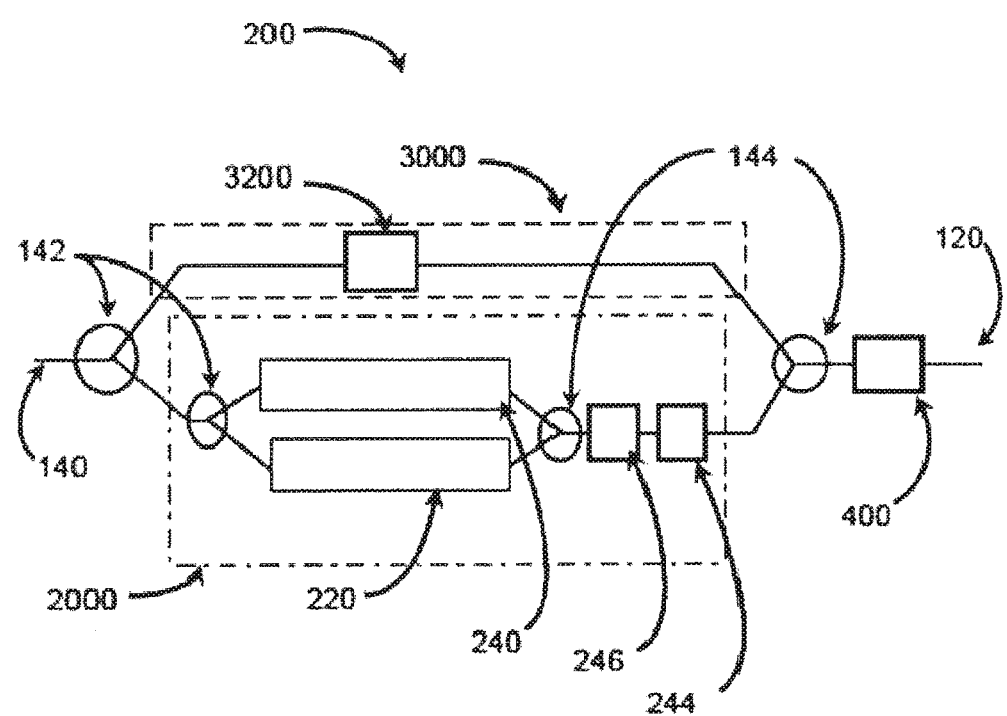
FIG. 2C: Schematic of a distortion removing type cell.

Referring to FIG. 2C, cell 200 is any type that, on receiving a distortion inducing input signal, can provide a distortion removed output signal. Cell 200 is any type that can remove distortion created by an active or other distortion-susceptible type of component.

Cell 200 comprises an input 140, splitter 142, distortion removing path 2000 and native signal path 3000 and combiner 144. Distortion removing path 2000 comprises a splitter 142, first channel 240, second channel 220 and combiner 144. Distortion removing path 2000 is any type that can provide a null passband type signal having amplitude reduced by between 1 dB and 200 dB at desired frequency. Native signal path 3000 is type that can provide a native type signal.

First channel 240 is any type that can provide a signal that is at least partly amplitude balanced and/or anti-phase with respect to signal from second channel 240. First channel 240 and/or second channel 220 can comprise one or more active, or other distortion-susceptible component such as an active type. Distortion removing path 2000 can additionally comprise phase shifter 244 and/or amplitude compensator 246. In some cases, native signal path 3000 can comprise a delay providing element 3200 of any type.

Cell 200 further comprises a combiner 144 of any type that can combine signal from distortion removing path 2000 and from native signal path 3000 to provide signal substantially free of distortion at desired frequency. Cell output 120 can be connected to second device 400 of any type, e.g. filter or cell, that can reduce signal amplitude at least one undesired frequency.

Figure 3:
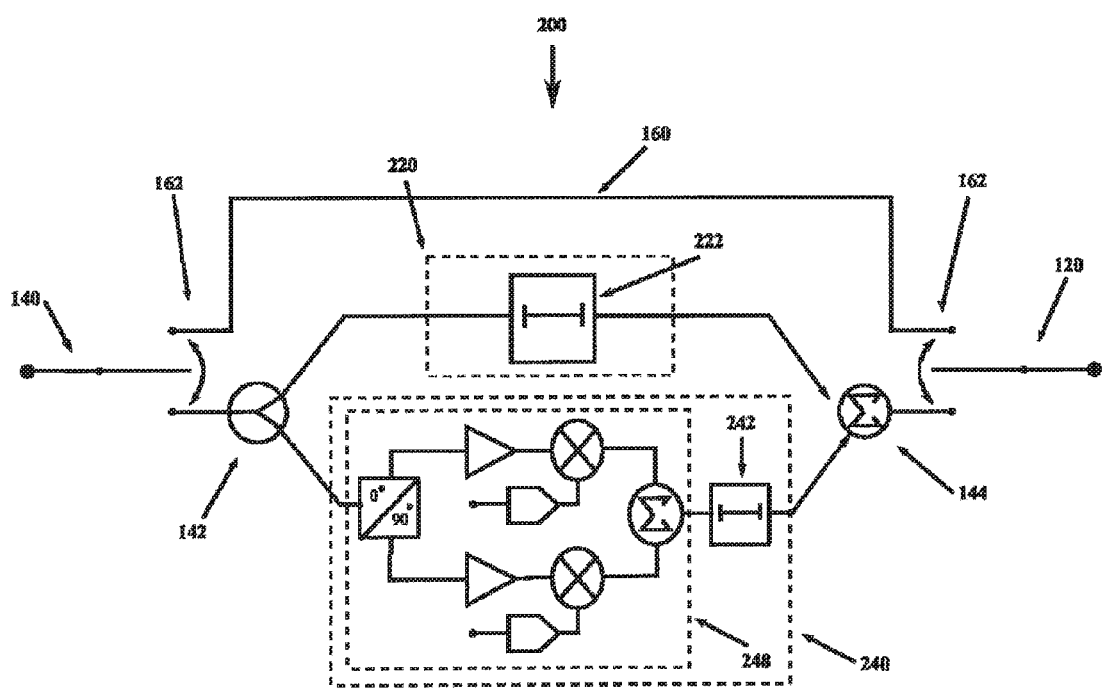
FIG. 3: Schematic of a cell comprising a vector modulator.

FIG. 3 illustrates a cell 200 wherein at least one channel 220, 240 can comprise a vector modulator 248, which is any type of device that can modify at least one signal aspect of: phase, amplitude and delay. In some cases, vector modulator 248 can further comprise at least one of: analog digital converter 249a and control input 249b. Converter 249a is any type that can convert a signal between digital and analog type. Control input 249b is any type that can provide a digital and/or analog signal. In some cases, channel 220, 240 comprising a vector modulator 249a can further comprise at least one of: delay element 222, 242, phase shifter 224, 244 and amplitude compensator 226, 246.

Figure 4:
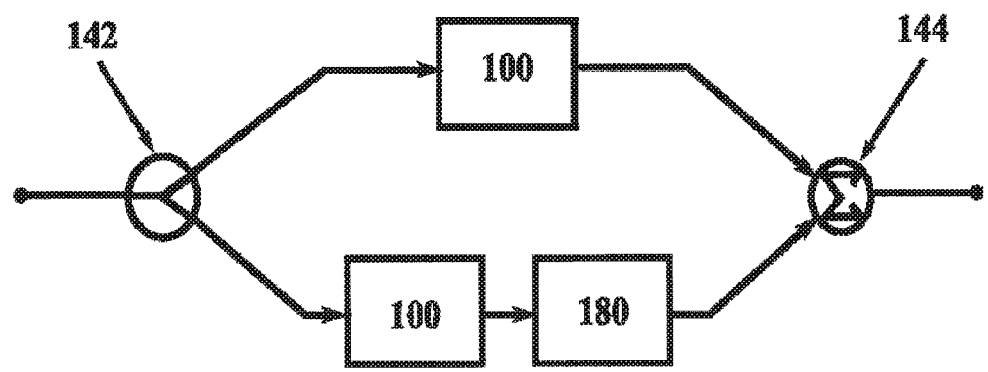
FIG. 4: Schematic of a dual-unit filter.

FIG. 4 illustrates a dual-unit type filter 10 comprising unit input element 102, splitter 142, first unit 100, second unit 100, and combiner 144. In some cases, dual-unit filter additionally comprises at least one of additional phase shifter and additional delay element. While described as a dual-unit type of parallel configuration, filter 10 can comprise other numbers of units 100 and/or other configurations.

Figure 5:
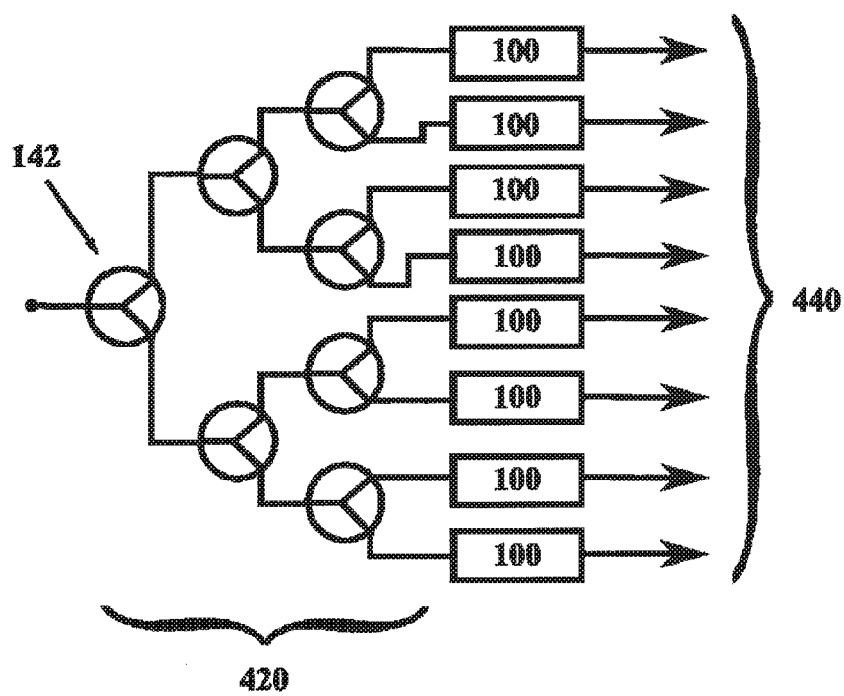
FIG. 5: Schematic of a multi-channel filter.

FIG. 5 illustrates the filter 10 configured as a multi-channel device for modifying a detected signal to provide a plurality of desirably received signal, such as for disjoint aggregation of channels to provide greater bandwidth. Multi-channel filter 10 comprises a splitter network 420 and a plurality of unit 100 each having an output element 104. It will be evident that dual-unit or other configuration can be substituted for one or more unit filter 100 in such a configuration of filter 10.

Figure 6:
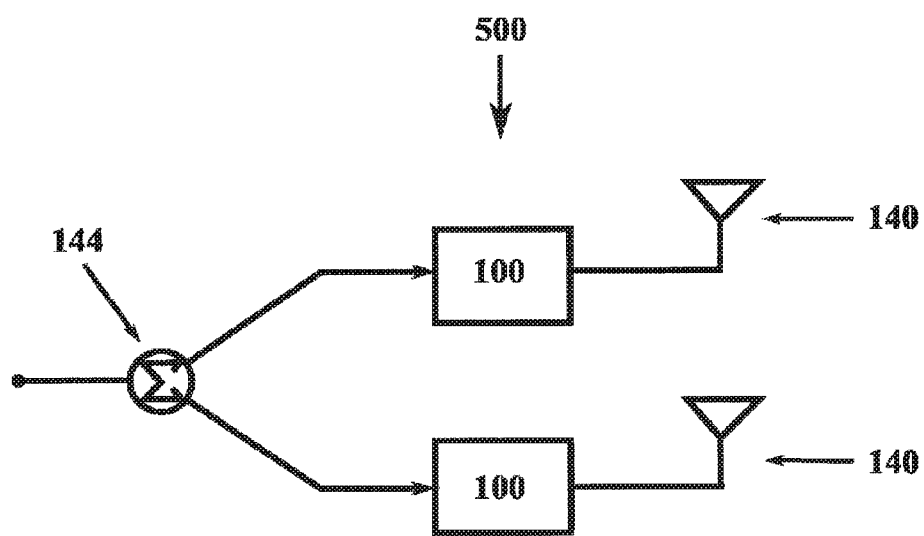
FIG. 6: Schematic of a spatial steering filter.

FIG. 6 illustrates a filter 10 for filtering and combining signals from a plurality of antenna 20 such as to provide spatial filtering or enhanced signal gain. In this example, first antenna 20 is connected to a first unit 100, a second antenna 20 connected to a second unit 100 and first unit 100 and second unit 100 are connected to a combiner 144. In some cases, at least one unit 100 further comprises a phase shifter 180. Configurations in addition to that shown are also acceptable.

Figure 7:
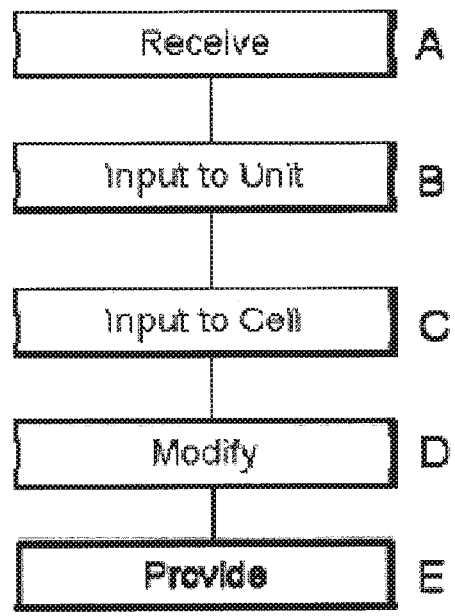
FIG. 7: Primary steps of the method.

FIG. 7 summarizes the filter method, which comprises at least one step of: A) receiving a signal, B) providing signal to a unit, C) providing signal to a cell, D) modifying provided signals to provide desirable signal, and E) providing said modified signal to a user or secondary device such as a radio receiver. In some cases, the method comprises transmitting a signal via an antenna or other type transducer. In some cases, transmitting and/or receiving comprises selecting frequency corresponding to one or more channel frequency having available capacity. In some cases, receiving comprises removing at least a portion of a signal transmitted via antenna providing received signal.

Figure 8A:
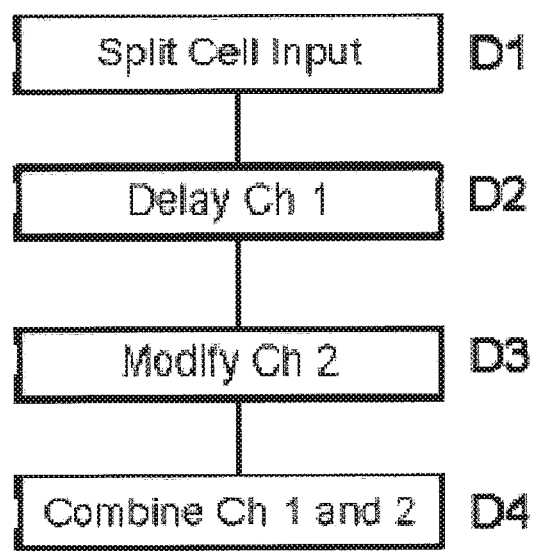
FIG. 8A: Additional steps of the method.

FIG. 8A provides additional detail of the method, wherein; D1) cell input signal is split into a first channel input signal and a second channel input signal, D2) first channel signal is modified by delaying, D3) second channel signal is modified by at least one of: phase shifting, amplitude compensating and delaying, D4) combining first channel signal and second channel signal by constructive and/or destructive interference, as means of providing a filter performance characterized by at least one of: center frequency, passband width, ripple, stopband, loss, settling time, and tuning rate.

Additional filtering can be provided by at least one serially connected second cell which can receive a first cell output signal as a second cell input signal. Second cell input signal is modified by second cell with respect to at least one of: delay, phase and amplitude to provide at least one of: second center frequency, second passband width, second rolloff and second stopband. Second center frequency can be equivalent to first center frequency although this is not required. Output signal of second cell can comprise a passband width equal to or less than first cell output signal passband width. Output signal of second cell roll off can be steeper that output signal roll off of first cell. Output signal of second cell stopband rejection can be greater than first cell output signal stopband rejection. Although described in terms of a method of decreasing passband width, the invention comprises a plurality of cells for which tuning can be conducted in any sequence, i.e. timing is of commutative type.

Filter center frequency is provided by selecting group delay difference and/or phase difference between first channel signal and second channel signal. In some cases, center frequency is selected by controlling gyrator or active inductor to provide a circuit resonance proximate the desired frequency. Difference in delay and/or phase can be negative, positive or zero. Passband width is provided by group delay difference between first channel signal and second channel signal. Unit passband width is initially determined in the first cell but can be narrowed (around the set center frequency) by selection of delay and/or center frequency in one or more of the additional cells. Rolloff and stopband rejection can be determined by selecting the number of cells in a unit.

Filter can provide any center frequency between 0 Hz and 300 GHz for any type of signal. In typical practice signals are filtered to provide any center frequency between 3 MHz and 200 GHz. Filter can provide any passband width between 0.0001% and 200% of center frequency. In some cases, center frequency and/or passband width can be altered during use. Filter can be configured by selection of number of cells to provide any rolloff between 1 and 90 dB per octave and stopband providing between 1 dB and 150 dB of out of band rejection.

The method comprises providing a desirably received signal further comprising spatial filtering by any means, such as beam and/or null steering. Steering is conducted by providing a phase delay of signal from one unit with respect to a second. For example, output of a first unit is phase shifted with respect to output of a second unit, and first and second output signals are combined to provide a steered desirably received signal. Additional spatial filtering can be provided by range gating to provide desirably received signals further comprising ranging.

The method can comprise at least one of converting, down converting, up converting and modulating. The method can comprise providing analog and/or digital signal to a secondary device, such as receiver, memory, antenna, indicator, or display.

Figure 8B:
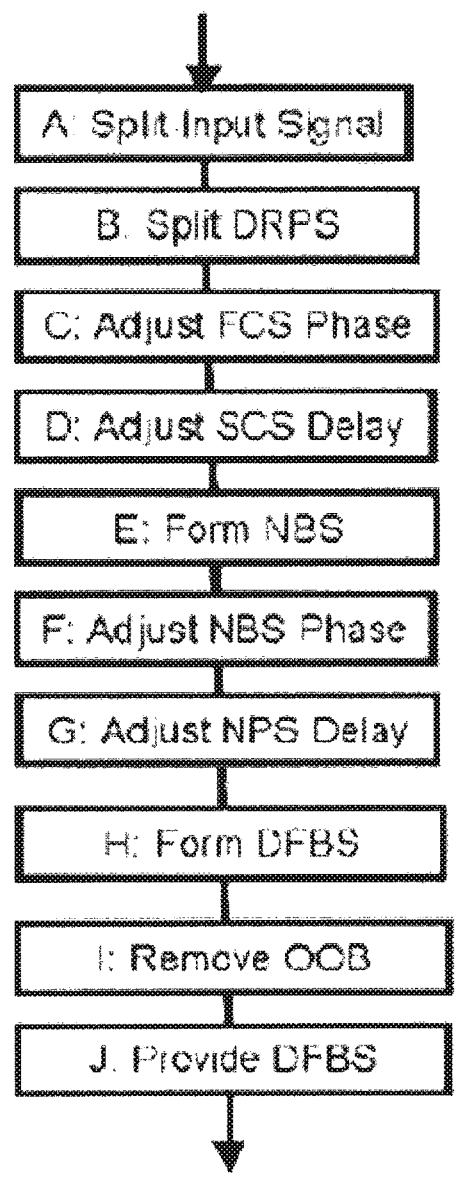
FIG. 8B: Method steps including distortion removing.

Referring to FIG. 8B, a distortion free passband signal (DFBS) is provided by at least one step of: a) split a cell input signal to provide a signal to distortion removing path and a signal to a native path, b) split distortion removing path signal (DRPS) to provide a first channel signal (FCS) to first channel and a second channel signal (SCS) to second channel, c) adjust FCS phase to be at least partly anti-phase with respect to SCS at desired frequency as means of providing destructive interference, d) adjust SCS delay to provide desirable output signal passband width, e) combine FCS and SCS to form a null bandpass signal (NBS) having substantially null amplitude at desired frequency or frequencies, f) adjust phase of NBS relative to signal from native path (NPS) at desired frequency, g) adjust delay of NPS to provide desired passband width, h) combine NBS and NPS to provide constructive interference there-between to form a distortion free bandpass signal (DFBS), i) provide DFBS to other component of any type that can reduce amplitude of at least one undesired, or out of band (OOB), frequency, j) provide DFBS to receiver or other device.

Figure 9A:
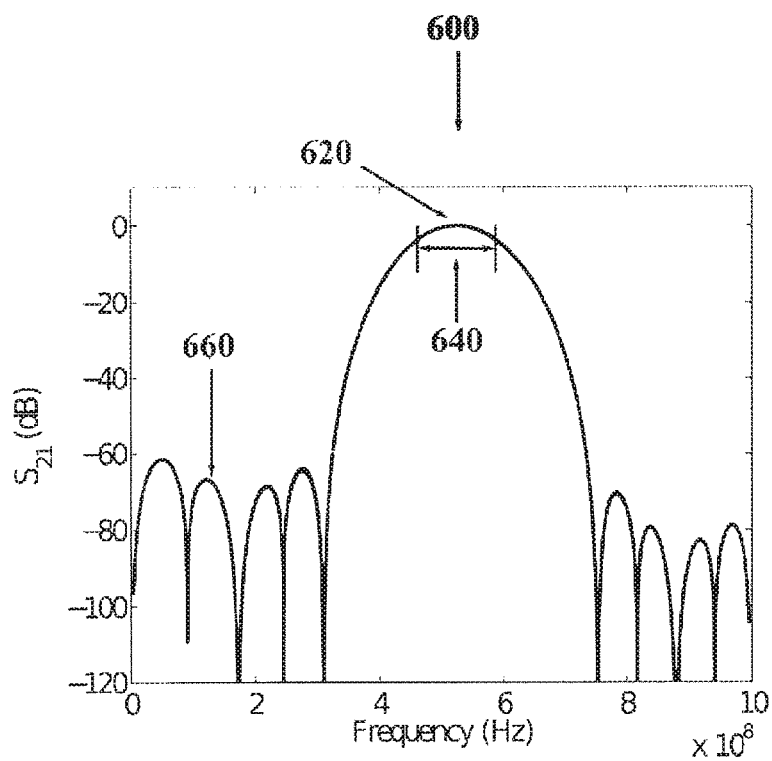
FIG. 9A: Single unit filter with 100 MHz passband at 530 MHz.
Figure 9B:
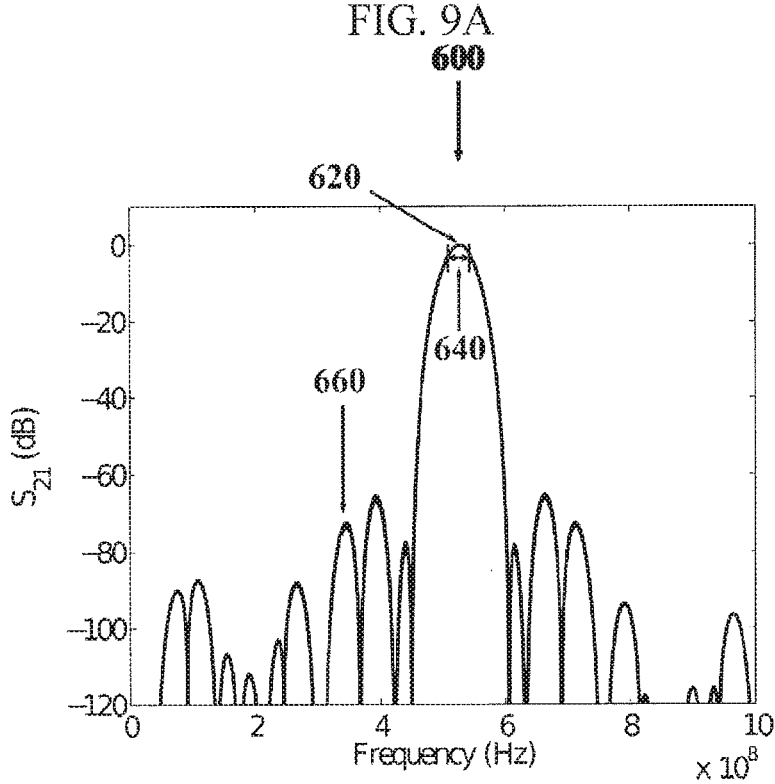
FIG. 9B: Single unit filter with 30 MHz passband at 530 MHz.
Figure 9C:
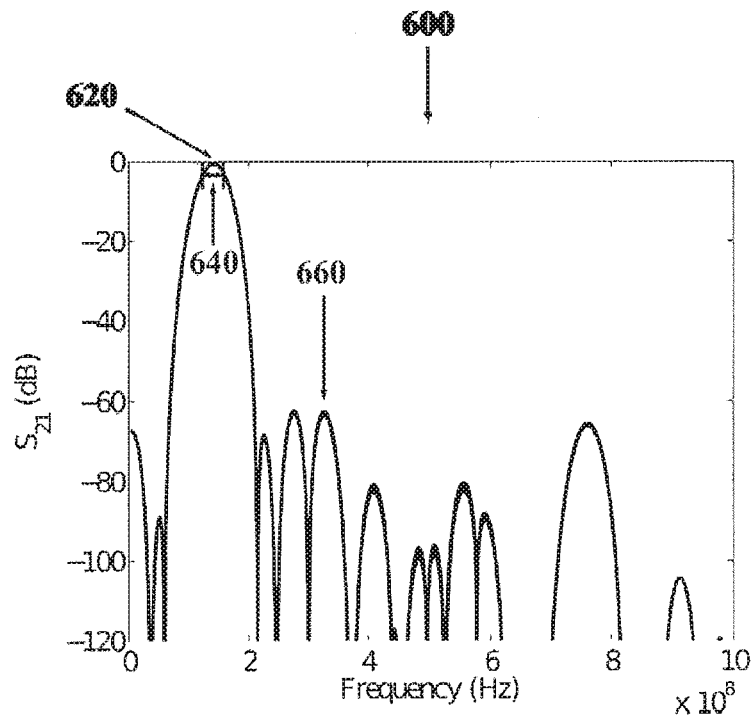
FIG. 9C: Single unit filter with 30 MHz passband at 140 MHz.

FIGS. 9A, 9B and 9C illustrate performance 600 of some acceptable single-unit configurations having values of passband center frequency 620 and width 640, showing only a representative portion of the frequency range of the inventive 10. It should be noted that configuration of filter 10 providing performance 600 illustrated FIGS. 9b, 9c and 9d can differ only in the tuning aspect of configuring. It should further be noted that performance 600 illustrated in FIG. 9A can be provided by reducing the number of cells 200 operative in a unit 100 such as by using a bypass 160 to circumvent one or more cell 200 with the signal.

Figure 9D:
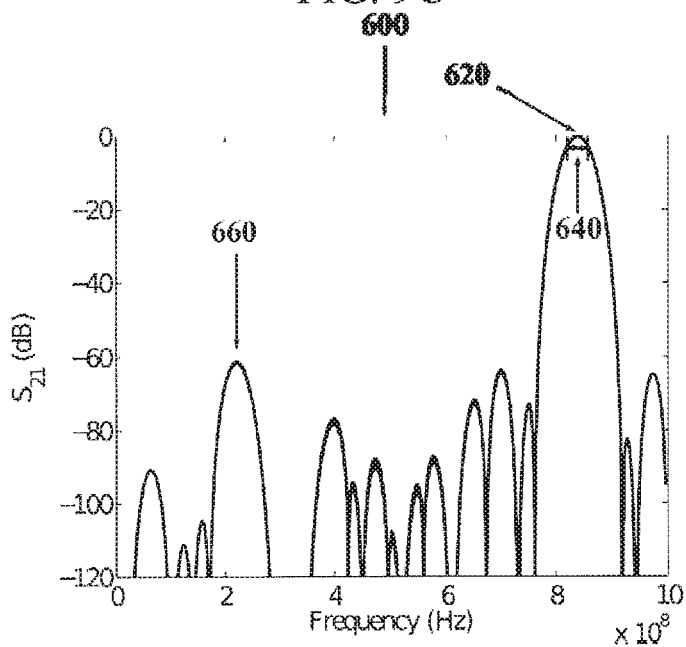
FIG. 9D: Single unit filter with 30 MHz passband at 830 MHz.

FIG. 9A illustrates performance 600 comprising a center frequency 620 of 530 MHz, width of passband 640 of 100 MHz and stopband 660 at −60 dB. FIG. 9B illustrates performance 600 comprising center frequency 620 of 530 MHz, with of passband 640 of 30 MHz and stopband 660 at −60 dB. FIG. 9C illustrates performance 600 of filter comprising center frequency 620 of 140 MHz, a width of passband 640 of 30 MHz and stopband 660 at −60 dB containing. FIG. 9D illustrates performance 600 of filter 10 comprising center frequency 620 of 830 MHz, width of passband 640 of 30 MHz and stopband 660 at −60 dB. The filters of FIGS. 9B, 9C, and 9D can have the same number of cells and group delay differences but are configured differently with respect to phase difference. Any center frequency 620 between 0 Hz and 300 GHz, width of passband 640 between 0% and 200% of center frequency and/or stopband 660 between −3 dB and −200 dB are also acceptable.

Figure 10:
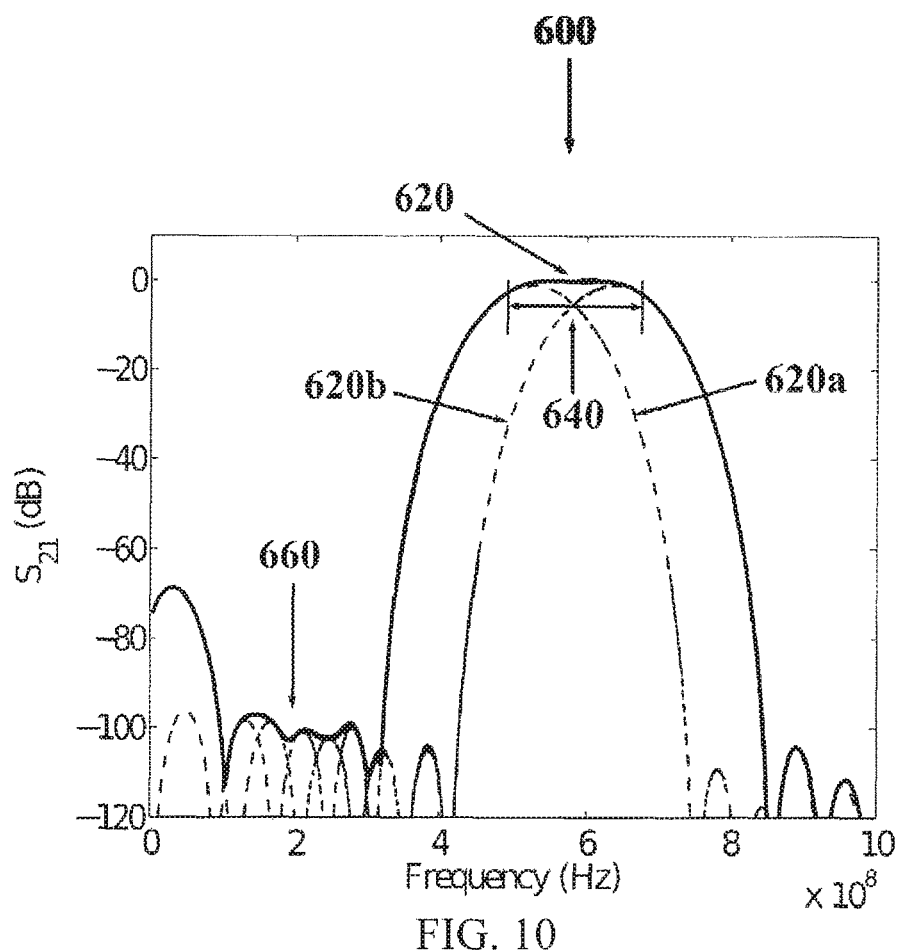
FIG. 10: Dual-unit filter with maximally flat passband centered at 570 MHz.

FIG. 10 illustrates filter performance 600 of a dual-unit type of filter 10 having a first unit 100 and a second unit 100, the latter configured in this example to modify at least one of: phase, amplitude and phase and phase difference to provide a 570 MHz value for center frequency 620, width of passband 640 of 180 MHz and a stopband 660 at −100 dB. The performance 600 of such a dual-unit type filter 10 can provide a flat passband type, such as one comprising ripple less than 0.1 dB, although any value between 0 dB and 10 dB is also acceptable. In some cases, filter performance 600 comprises at least one type of: maximally flat and zero loss.

Performance 600 comprising a flattened passband is provided by combining performance 620a, 620b of two filter units in a parallel configuration filter 10, which units are configured in this example to provide a passband width 640 of 100 MHz and stopband 660 of −100 dB and to provide respective center frequencies of 530 MHz and 610 MHz.

Center frequency providing is conducted by shifting frequency of a portion of cell interference pattern to the desired passband center frequency by means of phase shifting and/or resonance tuning, e.g. of gyrator type component. Center frequency providing can be conducted together with passband width providing, although this is not required.

Frequency shifting is conducted by providing phase shift of second channel signal relative to first channel signal, creating a phase difference between them. Combining of first channel signal and phase shifted second channel signal is used to provide constructive interference at a plurality of frequencies with respect to a desirable center frequency and to provide destructive interference at a plurality of other frequencies. Center frequency providing can be conducted using a plurality of cell.

One method of center frequency providing by phase shifting is conducted by determination of the constructive and destructive interference regions, represented by the maxima of function x(f), defined as $$x(f) = k \lfloor f|\tau_1 - \tau_2| \rfloor - \pi f|\tau_1 - \tau_2|,$$

where f is the frequency, $\tau_1$, is the group delay through the first channel, $\tau_2$ is the group delay through the second channel, and k is a normalization function. In some cases k is equal to π, but can be any constant or normalization function used to isolate maximum regions of constructive or destructive interference as local function maxima.

Normalization of x(f) is conducted to provide maxima of x(f) that approximately equal zero, although this is not required. Maxima of x(f) are approximately equal to zero due to the periodic normalization provided by $k \lfloor f|\tau_1 - \tau_2| \rfloor$, allowing the exact center frequencies of constructive and destructive interference for a given cell to be located. If x(f) contains at least one maximum and a delay difference between first and second channels, phase shift $\phi_S$ providing desirable center frequency shift is described by $$\phi_S = \pi k_1 \tau_2 (f_m - f_c),$$

where $f_m$ is the frequency of the selected portion of the interference, $f_c$ is the desired center frequency of the filter, and $k_1$ is a tuning parameter which is usually but not necessarily equal to one.

If x(f) does not contain at least one maximum, phase shift $\phi_S$ can be described by $$\phi_S = \pi \pm \pi f_c |\tau_1 - \tau_2|,$$

where the sign of the phase shift is chosen according to sign of group delay difference between channels. From the foregoing, it will be apparent that selection of center frequency can be automated, although this is not required. It will be appreciated by those versed in the art that desirable phase shifting can be determined by other means such as coherence, statistical or gradient search methods. It will further be appreciated that center frequency can be provided by embodiments comprising a gyrator, active inductor or other controllable resonance providing component such as provided by bias voltages controlling component resonance frequency A plurality of cells each having individual values for second-channel group delay with respect to group delay of first channel, can be used to provide desirable passband width and desirable center frequency. In some cases, group delay can be set equal in a plurality of cells, in which cases cell number is selected to provide a desired stopband and/or rolloff without altering passband width.

According to the method, the output signal from any filter covered by this disclosure can be provided to any type of secondary device. In some cases, output signal is converted to digital form and/or further processed as part of such providing. In some cases, the method can further comprise at least one of: storing filter output for at least a time and/or presenting output to user by any means.

Summarizing the basic method, a signal is filtered by splitting an initial signal, e.g. of antenna type, into first and second channel signals, modifying at least one channel signal by at least one of amplitude compensation, phase shifting and delaying. Amplitude compensation is conducted to provide desirable amplitude of at least one channel. Phase shifting is conducted according to an analytic calculation to provide a desirable center frequency. Delaying is conducted to provide desirable passband width. Output of the filter is the provided, for example to a receiver or transmitter.

In some cases, the inventive device can comprise a tunable duplexer of any type that can protect a receiver against adverse effects of a transit signal entering at least one of filter and receiver. Duplexer is any type that can substantially prevent entry of at least a portion of a desirably transmitted signal from entering filter and/or receiver. Duplexer can be of any type that can reduce transmit signal power by filtering according to the inventive method. Duplexer is any type that can provide full duplex operation. Duplexer can comprise an active type diplexer that can prevent a transmitted signal comprising at least one frequency component at a desirably received signal from entering filter and/or receiver. Duplexer is any type that can provide that can full duplex operation for transmit and receive signals comprising signal components at a desirably received frequency.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

I claim:

1. A device for performing analog filtering of a signal, comprising:
   a first unit comprising:
     a first cell comprising:
       a first splitter for splitting said signal into a first signal and a second signal;
       a first channel connected to said first splitter for receiving said first signal;
       a second channel having at least one of a first delay element, a first phase shifter and a first amplitude compensator, wherein said second channel is connected to said first splitter for receiving said second signal;
       a first combiner for combining a signal output from said first channel with a signal output from said second channel to produce a first cell output signal;
     a second cell coupled to said first cell for receiving said first cell output signal, said second cell comprising:
       a second splitter for splitting said first cell output signal into a third signal and a fourth signal;
       a third channel connected to said second splitter for receiving said third signal;
       a fourth channel having at least one of a second delay element, a second phase shifter and a second amplitude compensator, wherein said third channel is connected to said second splitter for receiving said fourth signal;
       a second combiner for combining a signal output from said third channel with a signal output from said fourth channel to produce a second cell output signal; and
     a bypass for bypassing at least one of said first and second cells in accordance with a desired roll-off or stopband characteristic.

2. A device for performing analog filtering according to claim 1, wherein said first channel comprises at least one of an amplitude compensator, a phase shifter, and a delay element.

3. A device for performing analog filtering according to claim 1 wherein said second channel further comprises a vector modulator.

4. A device for performing analog filtering according to claim 1 further comprising a second unit connected to said first unit.

5. A device for performing analog filtering according to claim 4 wherein said second unit comprises a third cell and a fourth cell.

6. A device for performing analog filtering according to claim 4 wherein said second unit is connected in parallel to said first unit.

7. A device for performing analog filtering according to claim 6 wherein said second unit is connected in series with said first unit.

8. A device for performing analog filtering according to claim 1 wherein said first delay element comprises one of the following types: fixed and variable.

* * * * *